(12) United States Patent  (10) Patent No.: US 6,538,207 B1
Barth  (45) Date of Patent: Mar. 25, 2003

(54) STRAIN RELIEF STRUCTURES FOR LEAD CONNECTIONS

(75) Inventor: Phillip W. Barth, Portola Valley, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/053,062

(22) Filed: Jan. 18, 2002

(51) Int. Cl.[7] .................................................. H05K 1/02
(52) U.S. Cl. ........................ 174/254; 174/255; 361/749; 361/679
(58) Field of Search ................................ 174/254, 255, 174/261, 253; 367/773; 361/679, 760, 749; 257/773

(56) References Cited

U.S. PATENT DOCUMENTS

| 3,838,316 A | * | 9/1974 | Brown et al. ............... 361/679 |
| 4,928,206 A | | 5/1990 | Porter et al. ............... 361/385 |
| 5,032,898 A | * | 7/1991 | Bowen et al. ............... 257/433 |
| 5,148,266 A | * | 9/1992 | Khandros et al. ............ 257/773 |
| 5,645,702 A | | 7/1997 | Witt et al. .................. 204/501 |
| 5,658,413 A | | 8/1997 | Kaltenbach et al. ..... 156/272.8 |
| 5,804,022 A | | 9/1998 | Kaltenbach et al. ......... 156/257 |
| 5,882,571 A | | 3/1999 | Kaltenbach et al. ........ 264/400 |
| 5,902,435 A | | 5/1999 | Meis et al. .................. 156/230 |
| 6,005,991 A | | 12/1999 | Knasel ......................... 385/14 |
| 6,069,991 A | | 5/2000 | Hibbs-Brenner et al. ..... 385/50 |
| 6,088,498 A | | 7/2000 | Hibbs-Brenner et al. ..... 385/52 |
| 6,093,362 A | | 7/2000 | Kaltenbach et al. ........ 264/400 |
| 6,222,976 B1 | | 4/2001 | Shahid ........................ 385/134 |
| 6,273,327 B1 | * | 8/2001 | Murray et al. .............. 228/245 |
| 6,370,032 B1 | * | 4/2002 | Distefano et al. ........... 361/749 |

* cited by examiner

Primary Examiner—Albert W. Paladini

(57) ABSTRACT

A flex circuit system has a support member on which a first subsystem of the flex circuit system is mounted. A second subsystem of the flex circuit system is remote from the first subsystem. A lead is bonded to bonding points on the first and second subsystems and woven through apertures in the support member to secure the lead in relation to the first subsystem and minimize the tension and bending loads seen at the bonding points of the first subsystem.

20 Claims, 4 Drawing Sheets

STRAIN RELIEF STRUCTURES FOR LEAD CONNECTIONS

BACKGROUND OF THE INVENTION

Technical Field of the Invention

The present invention relates to fluidic, electrical, electronic, and optical flex circuits and connections thereto.

Description of Related Art

Flex circuits, also known as flexible circuits, flexible printed circuit boards, and flexible printed wiring, are circuits made in or on flexible substrates. While the substrates are usually substantially planar, they may be bent and folded in order to accommodate themselves to three-dimensional shape requirements.

Flex circuits are typically made of a flexible insulating material for example a polyimide such as KAPTON, a registered trademark of E.I. du Pont de Nemours and Co., Inc., although many other materials including paper, polyamide, polyester terephthalate (PET), random-fiber aramid (ex. NOMEX, a registered trademark of E.I. du Pont de Nemours and Co., Inc.), and polyvinyl chloride (PVC) may be used. Electrical leads and electrical devices such as microchips can be embedded within or upon the flex circuit. Fluid wells and trenches can be recessed within the surface of the flex circuit, and fluid capillary channels can be embedded within the flex circuit. Optical devices, for example, fiber optic elements, optical gratings, optical sources, and optical receivers can be embedded within or upon the flex circuit. A flex circuit having only electrical leads is often called an electrical flex circuit, while a flex circuit having fluid wells, trenches, or capillary channels is often called a fluid flex circuit or a microfluidic circuit. A flex circuit with optical elements can be referred to as an optical flex circuit or a flexible optical circuit; see, for example, U.S. Pat. Nos. 5,902,435; 6,005,991; 6,069,991; 6,088,498; and 6,222,976. Fluid flex circuits and microfluidic circuits can include electrical elements; see, for example, U.S. Pat. Nos. 5,645,702; 5,658,413; 5,804,022; 5,882,571; and 6,093,362. The advantageous three-dimensional nature of flex circuitry is well known. See, for example, U.S. Pat. No. 4,928,206.

Often it is difficult, costly, or both, to combine more than one of electrical, fluidic, and optical elements in the same flex circuit. It is often more cost effective to build electrical, fluidic, and optical components as separate subsystems and then connect the subsystems together. The final device may then be a composite of several different electrical, fluidic, and optical subsystems and may even incorporate other subsystems such as micro-electro-mechanical systems (MEMS) or micro-optical-electro-mechanical systems (MOEMS). Often, subsystems are designed to join with other subsystems and to interact directly with the other subsystems. However, in some cases the subsystems must interact through electrical, fluidic, or optical leads. These leads may join to the subsystems at bonding points. The bonding points are generally physically weaker than the leads and the subsystems to which they join. If the leads are moved or flexed in relation to their associated bonding points, then the bonding points may be loaded in tension and subjected to bending and torsional forces. The moving and flexing can cause failure at the bonding points.

Connecting a flex circuit type subsystem to a second subsystem, such as another flex circuit, a rigid printed circuit board, or a microchip, often requires approaching a planar surface of the second subsystem from out of the plane of the second subsystem. This transition in directions can result in strain on the bonding points between the first and second subsystem.

Prior art devices have focused on strengthening the bond at the bonding points, but space limitations and material constraints limit the ultimate strength of the bond. Therefore, there is a need for a manner of attaching leads in a flex circuit device that minimizes the loading, and thus the vulnerability of the bonding points.

There also exists a need for a cost-effective method of attaching a flex circuit to a system or subsystem in a manner which transfers the flex circuit from an attachment surface of the system or subsystem, through the plane of the surface, to an opposing surface of the system or subsystem.

SUMMARY OF THE INVENTION

The invention generally provides a system of securing a flex circuit relative to a bonding region in such a manner as to limit the loading at the bonding region and minimize the likelihood of a failure of the juncture. The invention also provides a cost-effective method of transferring a flex circuit from an attachment surface of a system through the plane of the surface to an opposing surface of the system.

The invention encompasses a flexible circuit device having a support member for supporting a lead bonding region. The support member has at least two apertures therein. A flexible lead is connected to the lead bonding region and woven through the apertures such that the flexible lead is retained in the support member in relation to the lead bonding region.

Mechanical or adhesive means may further be used to secure the flexible lead to the support member, wherein the mechanical or adhesive means have a greater rupture strength than the strength of the bond between the flexible lead and the second lead bonding region.

An advantage of the invention is that the flexible lead is secured in a position so as not to impart tensile and bending loads on the bonding point, thus minimizing the possibility of failure of the bond.

Another advantage of the invention is that if the support member is flexible, tension in the support member increases the frictional engagement of the flexible lead.

Another advantage of the invention is that the flexible lead can pass through the plane of the support member.

The above advantages and additional advantages will become apparent from the following detailed description when taken in conjunction with the accompanying drawings.

BRIEF DESCRIPTION OF THE DRAWINGS

The invention can be better understood with reference to the following drawings. The elements of the drawings are not necessarily to scale relative to each other, emphasis instead being placed upon clearly illustrating the invention. Furthermore, like reference numerals designate corresponding parts throughout the several views.

DETAILED DESCRIPTION OF THE EXEMPLARY EMBODIMENTS OF THE INVENTION

Figure 1A:
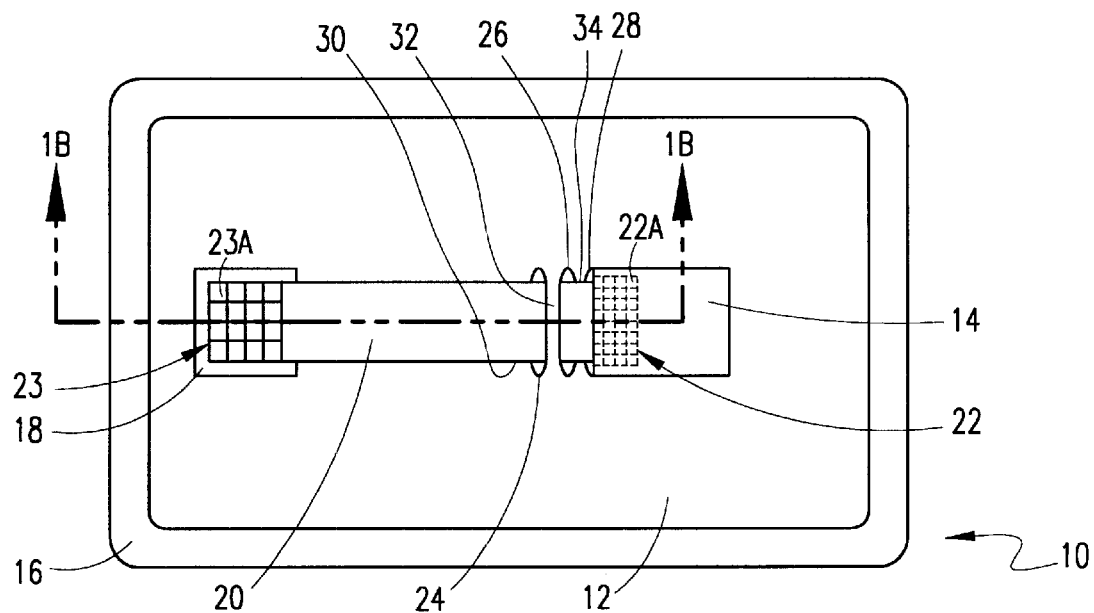
FIG. 1A is a top view schematic of a generalized exemplary circuit constructed in accordance with this invention.
Figure 1B:
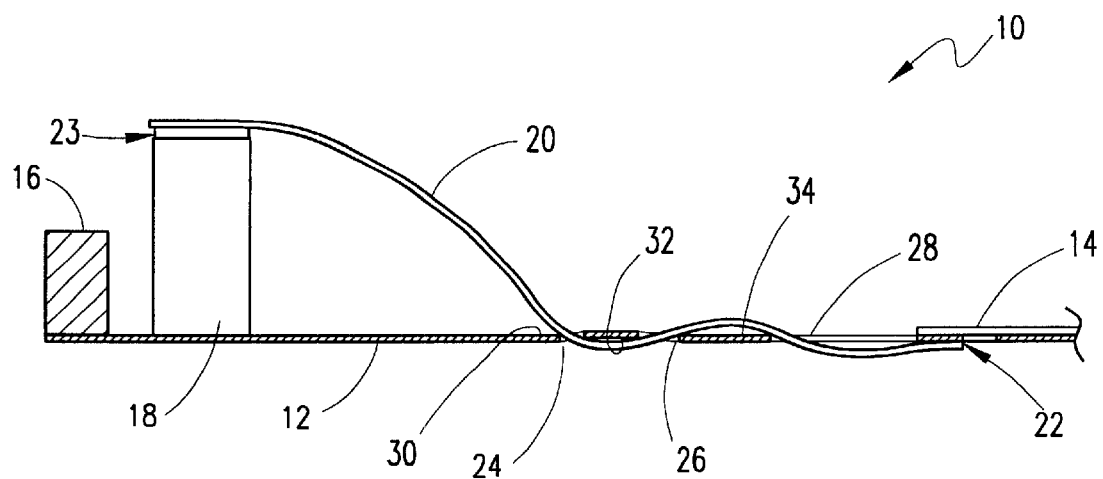
FIG. 1B is a side sectional view of the circuit of FIG. 1A taken along section line 1B—1B.

Referring first to FIGS. 1A and 1B, a generalized circuit 10 is depicted. The circuit 10 has a support member 12 for supporting one or more subsystems thereof. A first subsystem 14 is one such subsystem supported on the support member 12. First subsystem 14 can be, among other things, a passive fluidic system, an electrically operable fluidic system, an optical system, or an electronic circuit. A rim 16 can optionally be provided substantially about the perimeter of the support member 12. The support member 12 can be flexible and supported by the rim 16 loosely or with at least a portion of the support member 12 held in tension. Alternatively, the support member 12 can be relatively rigid, and if a rim 16 is provided, the rim 16 merely defines the perimeter.

A second subsystem 18 is supported on or near the support member 12, and remote from the first subsystem 14. The second subsystem 18 can also be, among other things, a passive fluidic system, an electrically operable fluidic system, an optical system, or an electronic circuit, or simply a strain relief block for interfacing the circuit 10 with the external world. The first and second subsystems 14, 18 are connected by at least one flexible lead 20. Lead 20 is a flexible circuit and may be an electrical channel, for example one or more insulated metallic wires, a fluidic channel, for example one or more capillary passages, an optical channel, for example one or more optical fibers or optical waveguides, or some combination of electrical, fluidic, and optical channels. In one exemplary embodiment, lead 20 can be configured as a ribbon, having a relatively flat and wide cross-section.

Lead 20 is connected to the first subsystem 14 at bonding region 22 and to second subsystem 18 at bonding region 23. Bonding regions 22 can comprise a single bonding point or multiple bonding points 22A on subsystem 14 arranged, for example, in an array. Similarly, bonding region 23 can comprise a single bonding point or multiple bonding points 23A on subsystem 18. Subsystem 18 and bonding region 23 are shown for illustrative purposes only and are not required parts of the invention. Instead of being bonded at region 23, lead 20 could be connected to some external system (not specifically shown). For the purposes of discussion, the strain relief provided by the bonding region 23 is considered to be separate from the strain relief provided by the present invention.

In the case of electrical channels, bonding region 22 can include electrical connections to the electrical components (not specifically shown) of the subsystem 14 and one or more electrical wires in lead 20 can be joined to the bonding region 22 by any suitable method known in the art. For example, individual electrical leads can be thermosonically bonded or welded or soldered onto the bonding region 22.

In the case of fluidic channels, bonding region 22 can include a port or ports for fluid communication and one or more capillary passages in lead 20 can be joined to the bonding region 22 by any suitable method known in the art, for example, by an adhesive.

In the case of optical channels, bonding region 22 can include one or more of optical elements or transmitting elements such as vertical-cavity surface emitting lasers or edge-emitting lasers and receiving elements such as photodiodes. In one example, one or more optical fibers can be attached to the exposed surface of the body holding the optical element in a manner similar to that taught in U.S. Pat. No. 6,088,498, to Hibbs-Brenner, et al. which is hereby incorporated by reference in its entirety. In another example, one or more optical waveguides in a flexible sheet can be attached near an edge of the body holding the optical element in a manner similar to that taught in U.S. Pat. No. 6,097,871, to De Dobbelaere, et al. which is hereby incorporated by reference in its entirety.

Support member 12 has two or more apertures such as apertures 24, 26, and 28 therein sized to closely receive lead 20. In an exemplary embodiment utilizing a ribbonshaped lead 20, apertures 24, 26, and 28 are preferably slots or slot like. Apertures 24, 26, and 28 are also positioned adjacent to the first subsystem 14. Lead 20 exhibits both a degree of stiffness and elasticity allowing it to be laced or woven through apertures 24, 26, and 28 such that the lead 20 is frictionally retained at one or more of the bearing regions 30, 32, and 34 in stable, relative placement near the first subsystem 14. In FIGS. 1A and 1B, three apertures 24, 26, and 28 are depicted, though virtually any number of apertures can be provided. Lead 20 is woven downward through the most remote aperture 24, up through an adjacent aperture 26, and back downward through the aperture 28 closest to the first subsystem 14 to bond at bonding region 22 on the first subsystem 14.

Once the lead 20 has been woven through the apertures 24, 26, and 28, and either before or after it is joined to the bonding region 22, lead 20 may be bonded to one or more of the bearing regions 30, 32, and 34. The adhesive bond may be accomplished by introducing a glue into one or more of the bearing regions 30, 32, and 34. Alternately, the bond may be accomplished by activating an adhesive substance already present in one or more of the bearing regions 30, 32, and 34, for example, by using thermal or radiation means such as heating to set a thermosetting epoxy, cooling from a high temperature to set a hot-melt glue, or ultraviolet radiation to set an ultraviolet-curable adhesive.

In addition or separately, mechanical fasteners described in more detail below may also be used at bearing regions 30, 32, and 34.

In use, weaving the lead 20 into the support member 12 prevents movement of the lead 20 relative to the support member 12, and thus relative to the first subsystem 14. The loading and resultant stresses, both in tensile and in bending, at the interface of the on-chip bonding regions 22 and the lead 20 are minimized. If the bonding region 22 is facing downward, as depicted in FIGS. 1A and 1B, the lead 20 will tend to press into the bonding region 22, thus promoting contact. However, the bonding region 22 can be on any portion of the first subsystem 14. Also, if the support member 12 is flexible and held in tension, tension in the support member 12 tends to increase the frictional engagement of the lead 20 because the apertures pull tight around the lead 20.

Figure 2A:
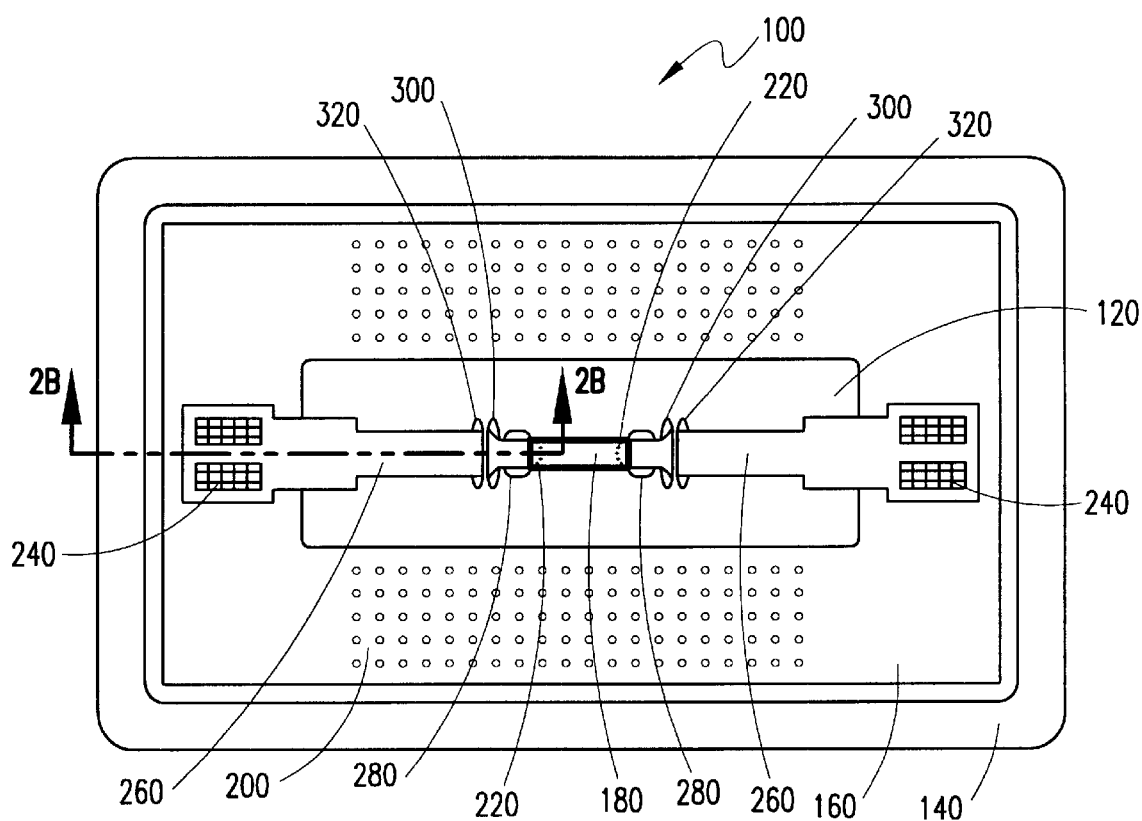
FIG. 2A is a top view of an exemplary fluid handling system constructed in accordance with this invention.
Figure 2B:
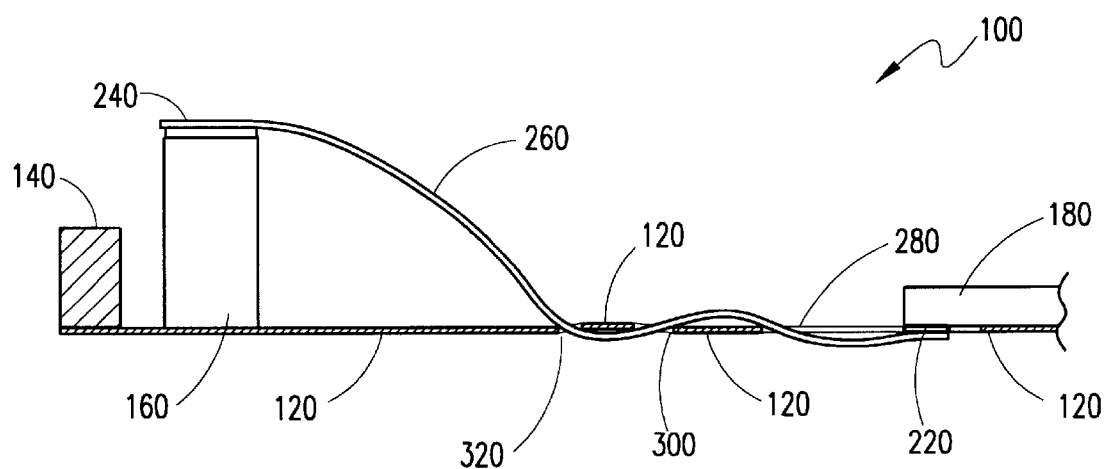
FIG. 2B is a side sectional view of the fluidic handling system of FIG. 2A taken along section line 2B—2B.

Referring now to FIG. 2A and FIG. 2B, an exemplary microfluidic device 100 is depicted. This particular microfluidic device 100 is a fluid handling system for receiving a fluid and re-depositing the fluid in a compact controlled manner, and is merely provided as an exemplary device for reference when describing the invention. The invention anticipates application of the concepts described herein to virtually any microfluidic, electrical, optical, or mechanical device, and is not to be limited to the particular fluid handling system herein described.

The exemplary device 100 has a support member 120 with an internal capillary network (not specifically show) that transports fluids between a microtiter manifold 160, affixed to the support member 120 near the rim 140, and a deposition chip 180, affixed to the support member 120 near its center.

The support member 120 can be constructed in many different configurations and of many different materials depending on the desired properties of the support member 120 and its specific application. The inventive concepts described herein are not limited to a specific support member construction or materials. For example, in the fluid handling system, the support member 120 can be layers of high strength metal foils bonded by adhesive, or can be single sheets of self-adhesive polymers. In another example, the support member 120 can be constructed from layers of a non-adhesive polyimide adhered with a thermoplastic adhesive polyimide.

The exemplary manifold 160 is a rigid structure, for example constructed from stainless steel, and can be integral with the rim 140. A plurality of reservoirs 200 are provided on the manifold 160 arranged in an array. The reservoirs 200 are positioned to be in communication with the capillary network, and serve to retain fluid for transport to the deposition chip 180.

The deposition chip 180 can be a single or multiple inkjet device that receives fluid from each capillary in the capillary network and ejects the fluid in a controlled manner through orifices (not specifically shown) extending from the bottom surface of the chip 180 through the support member 120. The deposition chip 180 can eject fluid received from the capillary network using virtually any method known in the art, for example, by way of a heated resistor within the chip that explosively boils or expands the fluid forcing it though an orifice or by a piezoelectric device within the chip that pressurizes the fluid and forces it through an orifice. As with most inkjet systems, the ejection mechanism can be electrically powered.

The deposition chip 180 receives power through an array of on-chip electrical bonding pads 220 on the bottom surface of the chip 180. The on-chip bonding pads 220 may correspond in number to the number of inkjet devices within the chip, or may take advantage of multiplexing electronics to be fewer in number than the number of inkjet devices within the chip. A corresponding array of electrical bonding pads 240 disposed on the upper surfaces of leads 260 can be supported remotely from the deposition chip 180 on or near the support member 120 and receive power from an external source (not shown). In the exemplary fluid handling system, the corresponding array of electrical bonding pads 240 are supported on the microtiter manifold 160. Flexible electrical leads 260 contact the on-chip electrical bonding pads 220 to the corresponding bonding pads 240 to provide electrical communication therebetween. The leads 260 each contain a number of wires corresponding to the number of electrical bonding pads 220, 240 that are being connected.

In the exemplary embodiment, the on-chip bonding pads 220 face downward in FIG. 2A. An opening or aperture 280 in the support member 120 around the on-chip bonding pads 220 allows the electrical leads 260 access to the pads 220. In the exemplary embodiment, two additional apertures 300 and 320, sized to closely accept the leads 260, are provided in the support member 120. As discussed above, the electrical leads 260 are laced or woven through the apertures 280, 300, and 320 such that they pass downward through one aperture 320, up through an adjacent aperture 300, and then back down through the aperture 280 adjacent the chip 180 to join with the on-chip bonding pads 220. By weaving the leads 260 through the apertures 280, 300, and 320, the support member 120 grasps and frictionally retains the leads 260 and prevents the leads 260 from moving relative to the support member 120 and the deposition chip 180. Further, a portion of the support member 120 between the two apertures 280, 300 tends to force the flexible leads 260 upward into the on-chip bonding pads 220. Forcing the leads 260 into the bonding pads functions to counteract tensional and bending loads at the connection of the leads 260 with on-chip bonding pads 220.

The additional apertures 300 and 320 are substantially adjacent to the first aperture 280 and to the deposition chip 180, rather than spaced away from the deposition chip 180. Having the apertures 280, 300, 320 in substantial proximity to the deposition chip 180 minimizes the amount of each electrical lead 260 which is free to move relative to the deposition chip 180. Also, more or fewer than three apertures can be provided and woven in the same manner. An embodiment with fewer than three apertures, however, does not retain the leads 260 as well as an embodiment with three or more, because the flexible membrane cannot grasp the leads 260 as tightly.

Figure 3A:
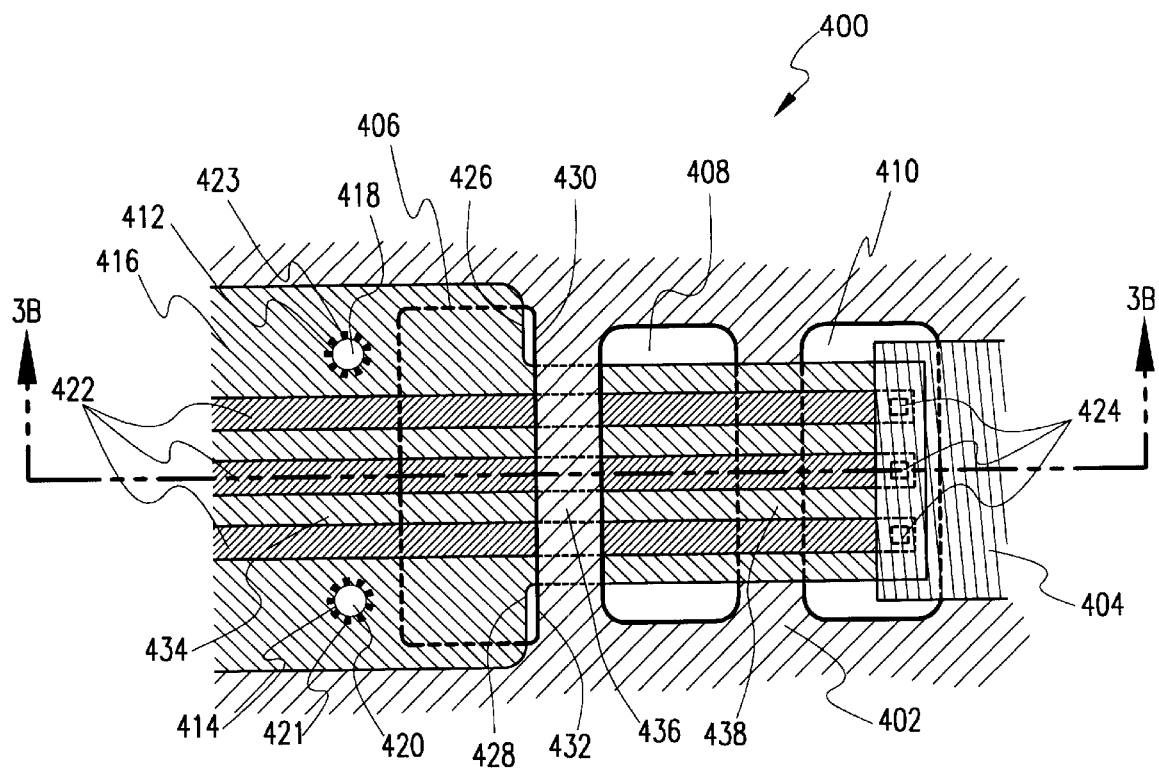
FIG. 3A is detail top view of an generalized exemplary circuit employing mechanical stop regions and mechanical fasteners.
Figure 3B:
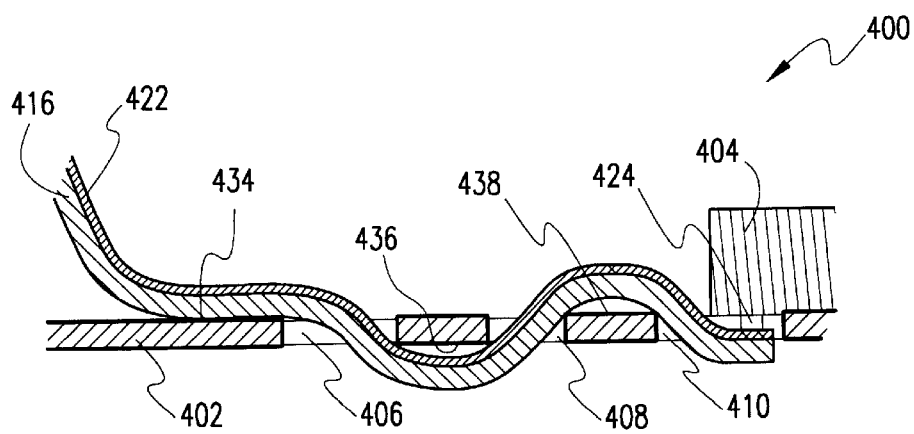
FIG. 3B is a side sectional view of the generalized exemplary circuit of FIG. 3A taken along section line 3B—3B.

Referring now to FIG. 3A and FIG. 3B, a generalized exemplary circuit 400 is illustrated similar to the exemplary device 10 illustrated in FIGS. 1A and 1B, but with the addition of mechanical stop features and mechanical fasteners. Support member 402 supports an electronic chip 404, and contains apertures 406, 408, 410, and through-holes 412 and 414. Flexible lead 416 has through-holes 418 and 420, and also has disposed on it upper surface traces 422 which contact corresponding bonding pads 424 on chip 404. Similarly to exemplary device 10, the flexible lead 416 is woven down through aperture 406, up through maperture 408, and down through aperture 410 to reach the bottom side of chip 404. However, in exemplary circuit 400, additional mechanical stop features 426 and 430 are provided in lead 416 and support member 402 respectively. The mechanical stop features 426 in the lead 416 can be defined by a widened portion of lead 416, and the mechanical stop features 430 in the support member 402 can be defined by an aperture 406 that is sized to prevent passage of the widened portion of the lead 416. Thus, the widened portion of lead 416 can bear against the support member 402 at aperture 406 to restrain the lead 416 and locate its tip near the bonding pads 424. The mechanical stop features 426,430 simplify the process of aligning and bonding channels 422 to bonding pads 424. The mechanical stop features 426, 430 also serve to closely align through-holes 418 and 420 in lead 416 with through holes 412 and 414, espectively, in support member 402, so that mechanical fasteners 421, 423 can easily be employed at bearing area 434. Such mechanical fasteners can include rivets, nuts and bolts, bayonet style fasteners, hook and loop type fasteners (ex. VELCRO, a registered trademark of Velcro Industries), thread, and other fasteners known in the art. The mechanical fasteners 421, 423 can optionally extend through support member 402, lead 416, or both, in one or more of the bearing regions 434, 436, 438. In addition or separately, glues or adhesives may be employed at bearing areas 434, 436, and 438 in a manner similar to that described above with reference to exemplary circuit 10.

Figure 4:
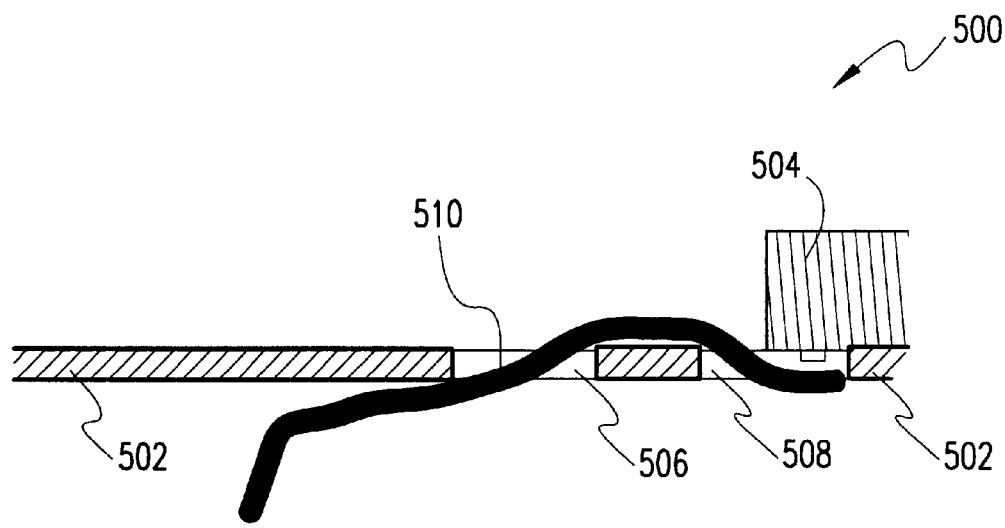
FIG. 4 is a detail side sectional view of a another generalized exemplary circuit showing an additional configuration of the invention.

FIG. 4 illustrates another generalized exemplary circuit 500 in cross section. Support member 502 supports chip 504 and has apertures 506 and 508. Flexible lead 510 is threaded through apertures 506 and 508 in such a manner that both ends of lead 510 protrude on the same side of support member 502. As above, after the lead is threaded through the apertures, one or more of mechanical fasteners and adhesives may be used to improve the strain relief characteristics of the structure.

Figure 5:
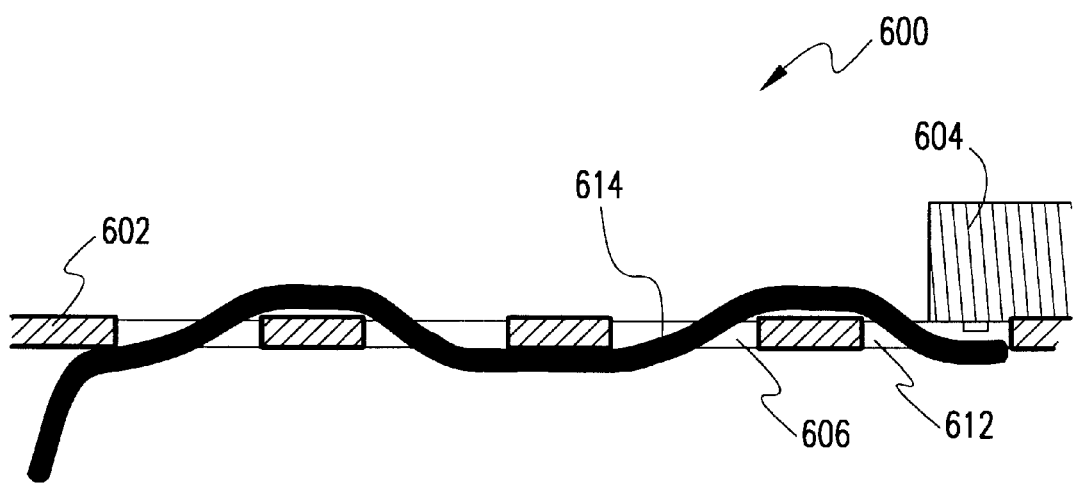
FIG. 5 is a detail side sectional view of a yet another generalized exemplary circuit showing an additional configuration of the invention.

FIG. 5 illustrates another generalized exemplary circuit 600 in cross section. Support member 602 supports chip 604 and has four apertures 606, 608, 610, and 612. Flexible lead 614 is threaded through apertures 606, 608, 610, and 612 in such a manner that both ends of lead 614 protrude on the downward-facing side of support member 602. As above, after the lead is threaded through the apertures, one or more of mechanical fasteners and adhesives may be used to improve the strain relief characteristics of the structure.

It is to be understood that while the invention has been described above in conjunction with preferred exemplary embodiments, the description and examples are intended to illustrate and not limit the scope of the invention. That which is described herein with respect to the exemplary embodiments can be applied to the construction of many different types of devices. Thus, the scope of the invention should only be limited by the following claims.

I claim:

1. A circuit device comprising:
    a support member having a first and second side, said support member supporting a subsystem on said first side;
    a bonding region disposed on said subsystem;
    at least two apertures spaced from said lead bonding region and extending through said support member from the first side to the second side; and
    a flexible lead connected to the bonding region and woven through at least two of the at least two apertures such that the flexible lead is retained in the support member in relation to the lead bonding region.

2. The device of claim 1 wherein the lead is at least one of an electrical lead, a fluidic lead, and an optical lead.

3. The device of claim 1 wherein the lead is configured as a ribbon.

4. The device of claim 1 wherein the support member and the subsystem are synonymous.

5. The device of claim 1 wherein at least one of the apertures is adjacent to the lead bonding region.

6. The device of claim 1 wherein the support member comprises a flexible membrane held in tension.

7. The device of claim 1 wherein the support member is substantially rigid.

8. The device of claim 1 wherein at least a portion of the lead is larger than at least one of the apertures, and the larger portion of the lead abuts the support member adjacent at least one of the apertures to restrain the lead.

9. The device of claim 1 wherein the lead is bonded to the support member adjacent to at least one of the apertures.

10. The device of claim 1 wherein the lead is affixed to the support member with a mechanical fastener.

11. The device of claim 1 wherein the lead is frictionally engaged by the support member adjacent at least one of the apertures.

12. The device of claim 1 wherein the support member has at least three apertures and wherein the lead passes through one aperture in a first direction, through an adjacent aperture in a second direction, and through a third aperture in the first direction.

13. A system incorporating a flexible circuit, comprising:
    a substrate having at least two apertures, said substrate having a first side and a second side;
    a subsystem affixed to a first side of said substrate;
    a bonding region disposed on the subsystem; and
    a flexible circuit connected to the bonding region and passing through the at least two apertures from at least said first side to said second side and back to said first side, the flexible circuit having a portion sized to prevent passage of the lead through a first one of the at least two apertures.

14. The system of claim 13 wherein the substrate is a flexible membrane held in tension.

15. The system of claim 14 wherein the flexible circuit is bonded to the substrate.

16. The system of claim 14 wherein the flexible circuit is affixed to the substrate with a mechanical fastener.

17. The system of claim 13 wherein the flexible circuit is frictionally engaged by the substrate via the at least two apertures.

18. The system of claim 13 wherein the flexible circuit is configured as a ribbon and the at least one of the at least two apertures is a slot.

19. The system of claim 13 wherein the at least two apertures are adjacent the bonding region.

20. The system of claim 14 further comprising a second bonding region, and wherein the second bonding region is on the second side of the substrate.

* * * * *